(12) United States Patent
Hagihara

(10) Patent No.: US 7,777,511 B2
(45) Date of Patent: Aug. 17, 2010

(54) INSPECTION APPARATUS HAVING A CAPACITIVE PRESSURE SENSOR BETWEEN THE MOUNTING BODY AND THE SUPPORT BODY

(75) Inventor: Junichi Hagihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 82 days.

(21) Appl. No.: 12/274,454

(22) Filed: Nov. 20, 2008

(65) Prior Publication Data
US 2009/0134894 A1 May 28, 2009

(30) Foreign Application Priority Data
Nov. 22, 2007 (JP) ............... 2007-303219

(51) Int. Cl.
*G01R 31/02* (2006.01)
*G01R 27/26* (2006.01)

(52) U.S. Cl. ....................... 324/758; 324/662

(58) Field of Classification Search ........................ None
See application file for complete search history.

(56) References Cited
U.S. PATENT DOCUMENTS 6,777,968 B1 * 8/2004 Kobayashi et al. .......... 324/758
6,791,171 B2 * 9/2004 Mok et al. ................... 257/678
6,992,500 B2 * 1/2006 Sugiyama et al. ........... 324/765
7,235,984 B2 * 6/2007 Honma ........................ 324/662
7,332,918 B2 * 2/2008 Sugiyama et al. ........... 324/754
7,504,844 B2 * 3/2009 Yamada ...................... 324/758

* cited by examiner

*Primary Examiner*—Paresh Patel
(74) *Attorney, Agent, or Firm*—Oblon, Spivak, McClelland, Maier & Neustadt, L.L.P.

(57) ABSTRACT

An inspection apparatus includes a movable mounting table for mounting thereon a target object, a probe card disposed above the mounting table and a control unit for controlling the mounting table. The target object is inspected by bringing a plurality of electrode pads of the target object mounted on the mounting table into contact with a plurality of probes of the probe card with a predetermined contact load by overdriving the mounting table. Further, the mounting table includes a mounting body whose temperature is controllable, a support body for supporting the mounting body, an elevation driving mechanism provided in the support body and pressure sensors provided between the mounting body and the support body to thereby detect the contact load. The control unit controls the elevation driving mechanism in accordance with detection signals from the pressure sensors.

8 Claims, 8 Drawing Sheets

US 7,777,511 B2

INSPECTION APPARATUS HAVING A CAPACITIVE PRESSURE SENSOR BETWEEN THE MOUNTING BODY AND THE SUPPORT BODY

FIELD OF THE INVENTION

The present invention relates to an inspection apparatus for inspecting electrical characteristics of a target object such as a semiconductor wafer or the like; and, more particularly, to an inspection apparatus capable of performing inspection with high reliability under a high or a low temperature condition.

BACKGROUND OF THE INVENTION

As exemplarily shown in FIG. 6, a conventional inspection apparatus includes: a movable mounting table 1 for mounting thereon a target object (e.g., a semiconductor wafer) W; a driving mechanism 2 for moving the mounting table 1 in a horizontal and a vertical direction; a probe card 3 disposed above the mounting table 1; an alignment mechanism 4 for performing alignment between a plurality of probes 3A of the probe card 3 and a plurality of electrode pads of the semiconductor wafer W on the mounting table 1; and a control device 5 for controlling various devices including the mounting table 1 and the alignment mechanism 4. After the probes 3A of the probe card 3 and the electrode pads of the semiconductor wafer W on the mounting table 1 are aligned to be in contact with each other, the semiconductor wafer W is overdriven in such a way that electrical characteristics of the semiconductor wafer W can be inspected by using a predetermined contact load under the control of the control device 5.

The alignment mechanism 4 has a first camera 4A for imaging the semiconductor wafer W on the mounting table 1, a second camera 4B for imaging the probes 3A of the probe card 3, and image processing units 4C and 4D for image-processing of images captured by the first and the second camera 4A and 4B. The alignment between the electrode pads and the probes 3A is carried out based on the respective captured images of the electrode pads of the semiconductor wafer W and the probes 3A of the probe card 3. Further, a reference numeral 4E in FIG. 6 represents an alignment bridge.

For example, during a high-temperature inspection of the semiconductor wafer W, the semiconductor wafer W on the mounting table 1 is heated to, e.g., about 150° C., by a temperature controlling mechanism installed in the mounting table 1 and, also, the electrode pads of the semiconductor wafer W on the mounting table 1 are aligned with the probes 3A of the probe card 3 by the alignment mechanism 4. After that, the electrode pads and the probes 3A are made to contact with each other by raising the mounting table 1 with the use of an elevation driving mechanism and the semiconductor wafer W is overdriven so that the electrode pads and the probes 3A are electrically brought into contact with each other by a predetermined contact load. Thereafter, the electrical characteristics of the semiconductor wafer W are inspected at a high temperature of about 150° C.

In an initial stage of the inspection process, although the semiconductor wafer W is heated to about 150° C., the probe card 3 is not heated and, thus, a large temperature difference exists between the semiconductor wafer W and the probes 3A. Accordingly, when the probes 3A are brought into contact first with electrode pads of the semiconductor wafer W during the inspection, the probes 3A are thermally expanded while being directly heated by the semiconductor wafer W on the mounting table 1. Further, the main body of the probe card 3 is thermally expanded while being gradually heated by the heat transmitted from the semiconductor wafer W side. As the devices in the semiconductor wafer W are repetitively inspected, the temperatures of the main body of the probe card 3 and the probes 3A gradually increase. Accordingly, the probes 3A are extended from a state shown in FIG. 7A to a state indicated by a fine line in FIG. 7B, and the tip positions thereof are gradually displaced from the original positions. Therefore, if the semiconductor wafer W is overdriven by a preset overdrive amount, the contact load from the probes 3A becomes excessive, which may damage the probes 3A and/or the electrode pads P. Moreover, due to the thermal expansion of the probe card 3, a long period of time is needed until the tip positions of the probes 3A become stable.

To that end, for a high-temperature inspection, the probe card is first brought into dimensional stabilization by completing the thermal expansion of the probe card by preheating, and then the high-temperature inspection is carried out thereafter. However, recently, the probe card has been kept being scaled up, and therefore, the preheating takes a long period of time, e.g., 20 to 30 minutes. Thus, in a technique described in, e.g., Patent Document 1, the probes are brought into a direct contact with the semiconductor wafer set to a high temperature for inspection and the probe card is preheated from its vicinity.

(Patent Document 1) Japanese Patent Laid-open Application NO. 2007-088203

In the technique of Patent Document 1, the probe card is hardly thermally expanded during the high-temperature inspection and, hence, a stable contact load between the probes and the semiconductor wafer can be obtained by a predetermined overdriving amount. Accordingly, the probe card or the semiconductor wafer can be prevented from being damaged. However, the technique of Patent Document 1 is disadvantageous in that the additional preheating time is required in addition to the inspection time and, hence, the total inspection time is increased by as much as the preheating time. In addition, it is disadvantageous in that the positions of the probes 3A are changed and the probe card is cooled while the mounting table 1 is separated from the probe card 3 in order to exchange a target object or perform the alignment.

SUMMARY OF THE INVENTION

In view of the above, the present invention provides an inspection apparatus capable of performing high-temperature inspection with high reliability by correcting changed tip positions of probes with an appropriate contact load in real-time without preheating a probe card and further capable of preventing damages of a probe card or a target object.

In accordance with the present invention, there is provided an inspection apparatus including: a movable mounting table for mounting thereon a target object; a probe card disposed above the mounting table; and a control unit for controlling the mounting table. The target object is inspected by bringing a plurality of electrode pads of the target object mounted on the mounting table into contact with a plurality of probes of the probe card with a predetermined contact load by overdriving the mounting table.

Herein, the mounting table includes: a mounting body whose temperature is controllable; a support body for supporting the mounting body; an elevation driving mechanism provided in the support body; and pressure sensors provided between the mounting body and the support body to thereby detect the contact load. The control unit controls the elevation driving mechanism in accordance with detection signals from the pressure sensors.

It is preferable that the pressure sensors are provided along an outer circumference of the mounting body.

Each of the pressure sensors may be formed as a capacitive pressure sensor.

Further, each of the pressure sensors may preferably be formed as an array sensor in which a plurality of capacitive pressure sensing elements is arranged two dimensionally.

It is preferable that the control unit visualizes on a display unit three dimensional distribution state of the contact load in a three dimension or simply in a two dimension based on the detection signals from the pressure sensors.

In accordance with the present invention, the present invention provides an inspection apparatus capable of performing high-temperature inspection with high reliability by correcting changed tip positions of probes with an appropriate contact load in real-time without preheating a probe card and further capable of preventing damages of a probe card or a target object.

BRIEF DESCRIPTION OF THE DRAWINGS

The objects and features of the present invention will become apparent from the following description of embodiments, given in conjunction with the accompanying drawings, in which:

FIGS. 2A to 2C describe an embodiment of a mounting table used in the inspection apparatus of the present invention, wherein FIG. 2A is an exploded perspective view thereof, FIG. 2B is a top view of principal parts of the mounting table of FIG. 2A, and FIG. 2C is a cross sectional view of the principal parts of the mounting table;

FIGS. 3A and 3B schematically illustrate a pressure sensor shown in FIGS. 2A to 2C, wherein FIG. 3A is a top view thereof, and FIG. 3B is an enlarged cross sectional view of a part shown in FIG. 3A;

FIGS. 5A and 5B present partially enlarged views showing a state where a high-temperature inspection is carried out by contacting a semiconductor wafer with a probe card on the mounting table shown in FIGS. 2A to 2C, wherein FIG. 5A is a cross sectional view showing a state right after the contact operation, and FIG. 5B is a cross sectional view depicting a state where the probe card is thermally expanded;

FIGS. 7A and 7B represent partially enlarged views showing a state where a high-temperature inspection is performed by contacting the semiconductor wafer with the probe card with the use of the inspection apparatus shown in FIG. 6, wherein FIG. 7A is a cross sectional view illustrating a state right after the contact operation, and FIG. 7B is a cross sectional view describing a state where the probe card is thermally expanded.

DETAILED DESCRIPTION OF THE EMBODIMENT

The embodiments of the present invention will be described with reference to FIGS. 1 to 5B which form a part hereof.

Figure 1:
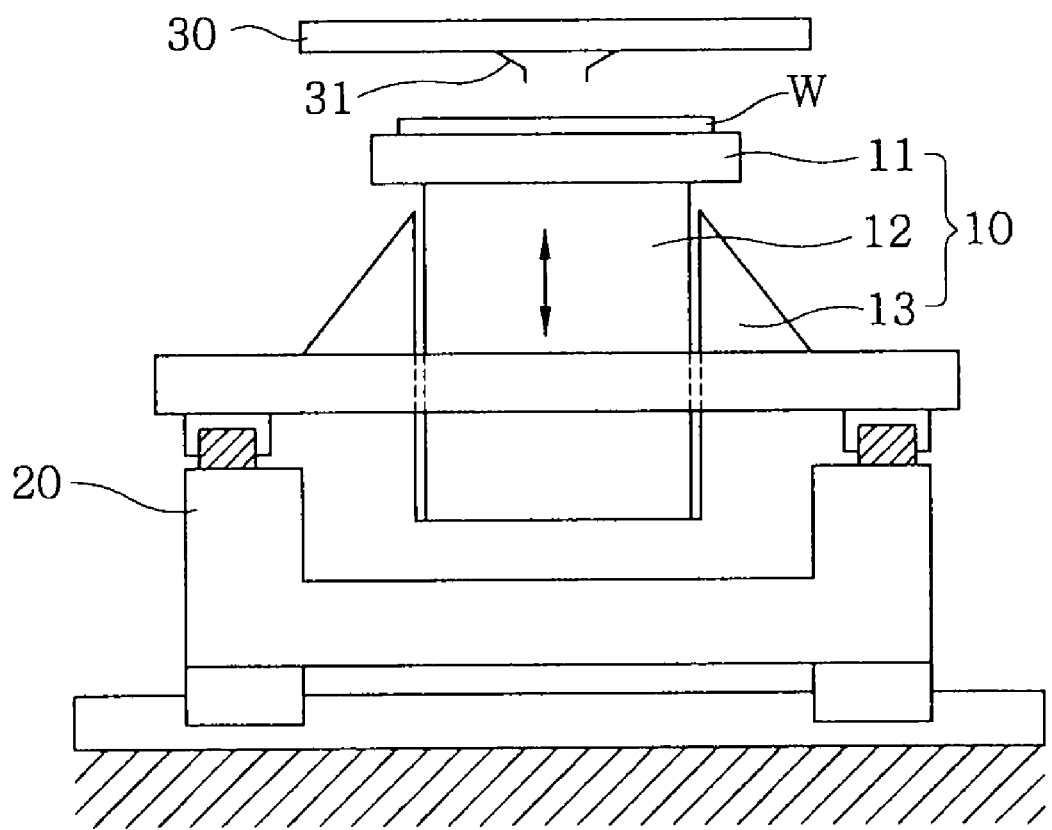
FIG. 1 shows a side view of principal parts of an inspection apparatus of the present invention.

As shown in FIG. 1, the inspection apparatus of the present embodiment includes: a mounting table 10 capable of moving in X, Y, Z and θ directions while mounting thereon a target object (e.g., a semiconductor wafer) W; an XY stage 20 for moving the mounting table 10 in X and Y directions; a probe card 30 disposed above the mounting table 10; an alignment mechanism (not shown) for aligning probes 31 of the probe card 30 and electrode pads of the semiconductor wafer on the mounting table 10; and a control unit 40 (see FIG. 4) for controlling devices such as the mounting table 10, the alignment mechanism and the like. A high-temperature or a low-temperature inspection of the semiconductor wafer W is performed by electrically contacting the probes 31 with the electrode pads of the semiconductor wafer W with a predetermined contact load by overdriving the semiconductor wafer W via the mounting table 10 under the control of the control unit 40.

Figure 2A:
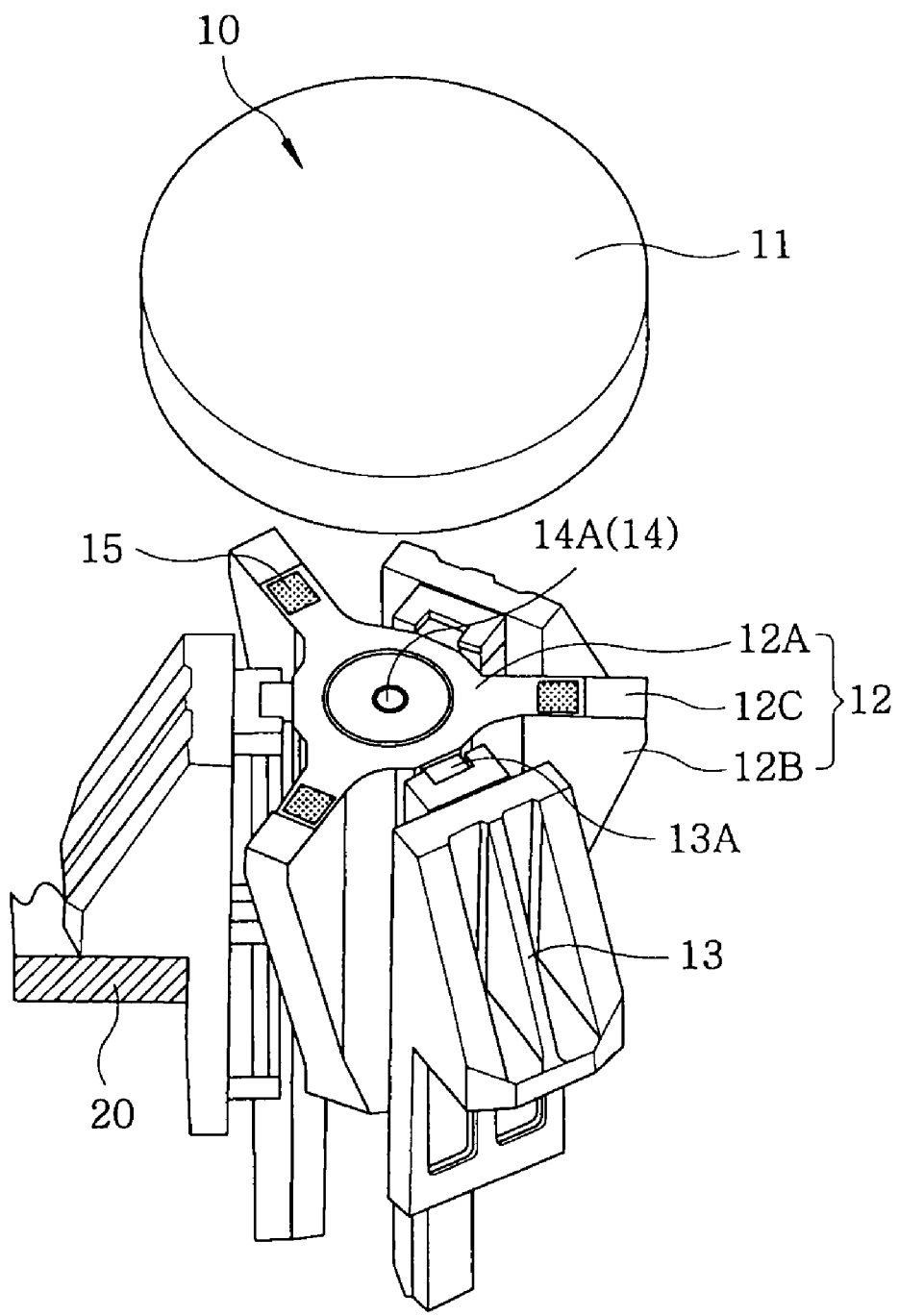
Figure 2B:
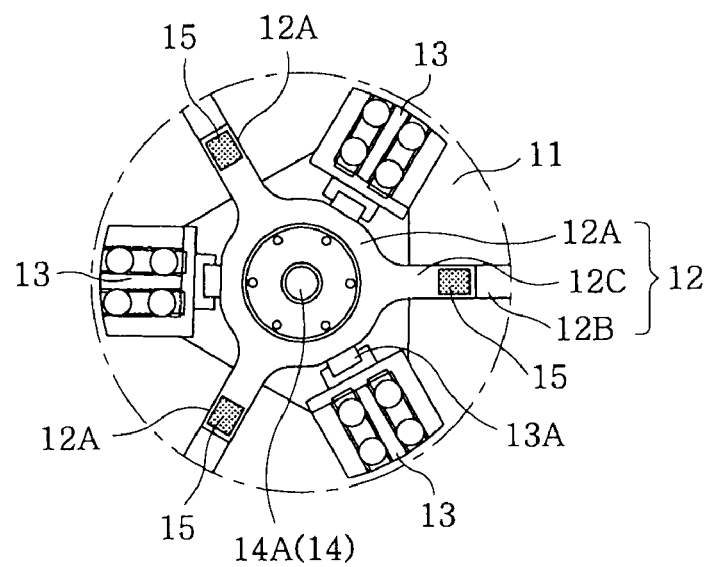
Figure 2C:
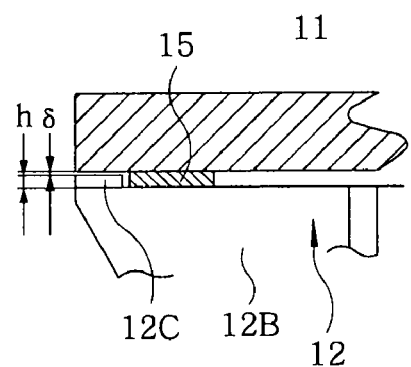

As can be seen from FIGS. 2A to 2C, the mounting table 10 includes: a mounting body 11 having therein a temperature controlling mechanism for heating or cooling the semiconductor wafer W to a predetermined temperature; a support body 12 for supporting the mounting body 11 at the center of the bottom surface thereof; and elevation support bodies 13 for vertically moving and supporting the support body 12 via elevation guides 13A, the elevation support bodies 13 being disposed at three locations spaced from each other at regular intervals along the circumference of the peripheral surface of the support body 12. After the semiconductor wafer W on the mounting body 11 is heated to a predetermined high temperature (e.g., about 150° C.), the high-temperature inspection of the semiconductor wafer W is performed by electrically contacting a plurality of electrode pads of the semiconductor wafer W on the mounting body 11 with a plurality of probes 31 of a probe card 30.

As illustrated in FIGS. 2A and 2B, the support body 12 has a cylindrical support main body 12A having a diameter smaller than an outer diameter of the mounting body 11 and reinforcing parts 12B projecting from the three locations spaced from each other at regular intervals along the circumference of the peripheral surface of the support main body 12A. These reinforcing parts 12B have a substantially right-angled triangular shape of which width gradually increases outwardly from lower portions toward upper portions of the support bodies 12.

As can be seen from FIGS. 2A and 2B, a ball screw 14A and a motor (not shown) forming the elevation driving mechanism 14 are accommodated in an inner space of the support main body 12A. The ball screw 14A is screw-coupled with a nut member fixed in the support body 12, and the motor is driven to vertically move the support body 12 with respect to the XY stage 20 (see FIG. 2A) via the ball screw 14A and the nut member.

For example, when the high-temperature inspection of the semiconductor wafer W is performed, the probe card 30 is thermally expanded by the contact with the heated semiconductor wafer W and the heat transmitted from the semiconductor wafer W. Therefore, even if the semiconductor wafer W is overdriven by a predetermined distance via the mounting table 10, the probe card 30 and the semiconductor wafer W may be damaged, since the tip positions of the probes 31 are changed due to the thermal expansion of the probe card 30 and because the contact load exceeds a predetermined value. Thus, in the present embodiment, pressure sensors are provided to maintain the contact load between the probes 31 and the electrode pads of the semiconductor wafer W at a level suitable for the high-temperature inspection.

That is, as shown in FIG. 2C, sheet-shaped flexible pressure sensors 15 are installed between the mounting body 11 and the top surfaces of the reinforcing parts 12B at three locations of the support body 12. These pressure sensors 15 detect a contact load between the semiconductor wafer W on the mounting body 11 and the probes 31 of the probe card 30 at the three locations, and the detection signals are outputted to the control unit 40. The control unit 40 vertically moves the mounting body 11 and the support body 12 by controlling the elevation driving mechanism 14 of the mounting table 10 based on the detection signals from the pressure sensors 15 at the three locations. Further, the contact load between the probes 31 and the electrode pads of the semiconductor wafer W is corrected so as to be maintained at an appropriate level. Hereinafter, a relationship among the pressure sensors 15, the mounting body 11 and the support body 12 will be described. Since the reinforcing parts 12B at the three locations have the same structure, one of them will be explained as an example.

As shown in FIGS. 2A to 2C, pedestal portions 12C for supporting the mounting body 11 are formed on the top surfaces of the reinforcing parts 12B. Each pedestal portion 12C is formed at an end portion of extended part from the top surface of the support main body 12A in a radial direction, and are formed to be slightly higher (e.g., about 2 mm) than the inner flat surface. The pressure sensors 15 are provided at the inner sides of the pedestal portions 12C. As illustrated in FIG. 2C, the pressure sensors 15 are formed to have a thickness slightly larger than a height h of the pedestal portions 12C, and the mounting body 11 is directly supported by the pressure sensors 15. Therefore, when the inspection of the semiconductor wafer W is not being carried out, a fine gap δ is formed between the mounting body 11 and the pedestal portions 12C. On the contrary, when the inspection of the semiconductor wafer W is being carried out, the mounting body 11 compresses the pressure sensors 15 by the contact load within a range of the fine gap δ. When the pressure sensors 15 are compressed, the contact load between the electrode pads of the semiconductor wafer W and the probes 31 of the probe card 31 is detected.

The contact load between the probes 31 of the probe card 30 and the electrode pads of the semiconductor wafer W is distributed to the pressure sensors 15 at the three locations. The pressure sensors 15 at the three locations detect different contact loads (pressures) depending on the contact positions of the probes 31. If the contact load between the electrode pads and the probes 31 is uniform in any parts of the semiconductor wafer W, a sum of the pressures detected by the pressure sensors 15 at the three locations become a uniform contact load. Accordingly, the high-temperature inspection can be performed with high reliability by controlling the sum of the pressures detected by the pressure sensors 15 at the three locations to match with the contact load suitable for the high-temperature inspection.

Figure 3A:
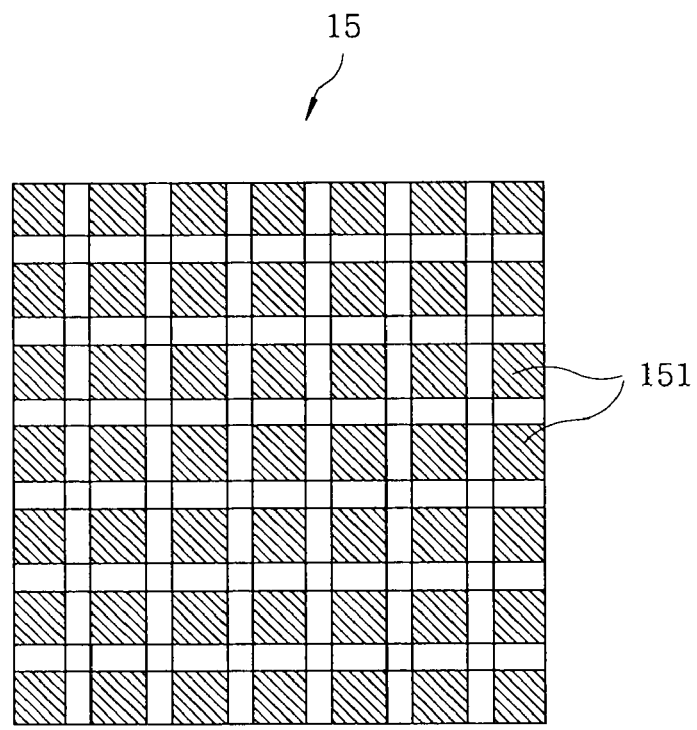
Figure 3B:
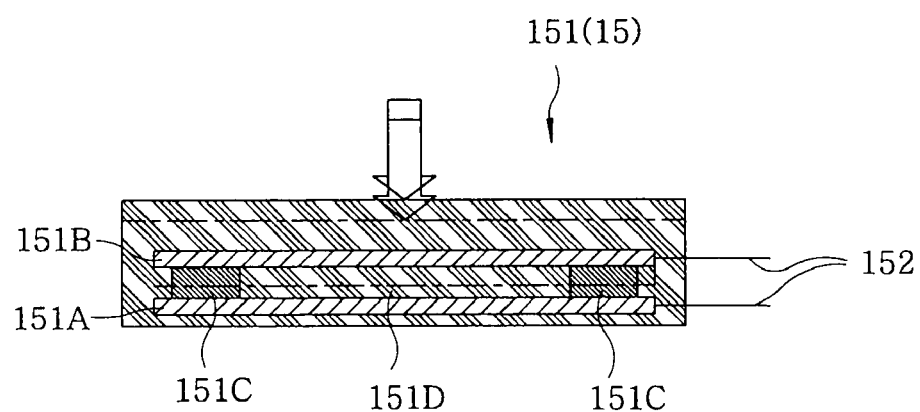

Although various sensors, e.g., a capacitive pressure sensor, a resistance pressure sensor and the like, are known to be used as the pressure sensors 15, the capacitive pressure sensor is used in the present embodiment. As depicted in FIGS. 3A and 3B, the pressure sensor 15 is formed as an array sensor in which a plurality of capacitive pressure sensing elements 151 are arranged two dimensionally (in rows and columns). FIG. 3B is an enlarged cross sectional view of the capacitive pressure sensing element 151.

As can be seen from FIG. 3B, the capacitive pressure sensing element 151 includes: a lower and an upper electrode 151A and 151B; one or more flexible insulating support bodies 151C for forming a gap of a predetermined distance between the electrodes 151A and 151B; an elastic insulator (e.g., silicon rubber) 151D covering the entire surface of the lower and the upper electrodes 151A and 151B and the gap formed by the insulating support bodies 151C; and lead lines 152 of the electrodes 151A and 151B. For example, the element main body is formed as a pressure sensing element having a size of about 1 mm×2 mm. Here, the insulating support bodies 151C and the insulator 151D may be made of the same material or different materials. When the contact load is applied to the pressure sensor 15 as indicated by an arrow, the insulating support bodies 151C and the insulator 151D are compressed. Accordingly, the distance between the lower and the upper electrode 151A and 151B is changed, and the capacitance between the electrodes 151A and 151B increases. A capacitance C, the surface area of individual electrodes S and distance between the electrodes d have a relationship of $C=k \cdot (S/d)$, wherein k indicates a constant. The insulator 151D covers the entire region of the array sensor. Although the pressure sensor 15 of the present embodiment is formed by arranging a plurality of capacitive pressure sensing elements 151, it may include a single capacitive pressure sensor.

Since the pressure sensor 15 is formed as an array sensor in which capacitive pressure sensing elements 151 are arranged two dimensionally, the pressure distribution can be recognized three-dimensionally based on the signals detected by the capacitive pressure sensing elements 151 by setting the positions of the capacitive pressure sensing elements 151 to X and Y coordinates and the detected pressures in each of the coordinates to Z coordinates.

Figure 4:
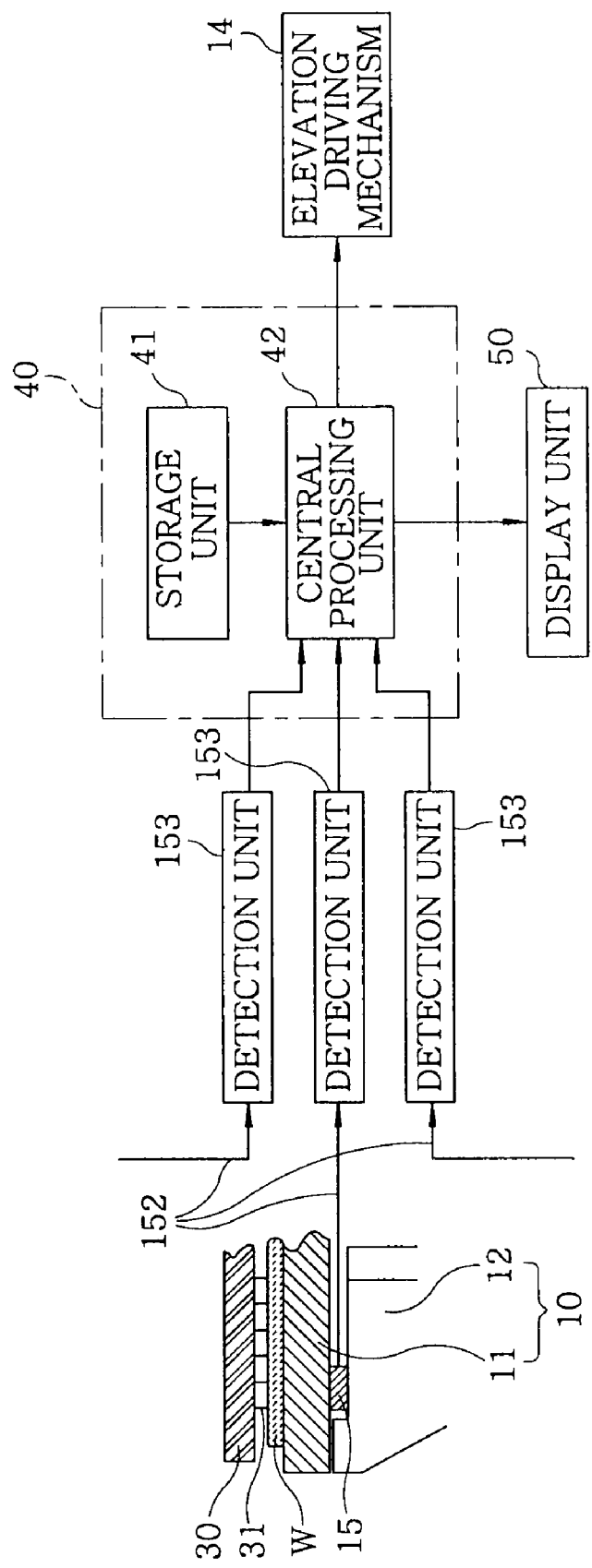
FIG. 4 provides a control system of the inspection apparatus having the mounting table shown in FIGS. 2A to 2C.

As shown in FIG. 4, the pressure sensors 15 at the three locations are connected to respective detection units 153 via lead lines 152, and output the detection signals to the control unit 40 via the respective detection units 153. As can be seen from FIG. 4, the control unit 40 stores therein a control program for controlling the elevation driving mechanism 14 based on the detection signals from the pressure sensors 15 at the three locations, and includes: a storage unit 41 for storing an appropriate contact load between the probes 31 and the electrode pads of the semiconductor wafer W as a reference contact load; and a central processing unit 42 for controlling the elevation driving mechanism 14 by reading out the control program from the storage unit 41 and performing an operation process based on the detection signals from the pressure sensors 15 at the three locations.

The central processing unit 42 has a function of detecting contact load between the probes 31 and the electrode pads of the semiconductor wafer W by summing the pressures detected by the pressure sensors 15 at the three locations under the instruction signal of the control program and controlling the vertical movement of the elevation driving mechanism 14 of the mounting table 10 based on the result of comparison between the detected contact load and the reference contact load read from the storage unit 41.

Further, the central processing unit 42 has a function of measuring a pressure distribution based on the detection signals from the capacitive pressure sensing elements 151 of the pressure sensors 15 at the three locations under the instruction signal of the control program and displaying the pressure distribution on a display unit 50 in a three dimension or simply in a two dimension. Thus, the pressure distribution detected by the pressure sensors 15 at the three locations can be visualized on the display unit 50.

Hereinafter, an operation of the inspection apparatus of the present embodiment will be explained with reference to FIGS. 5A and 5B. First of all, the mounting body 11 of the mounting table 10 is heated to a temperature that the semiconductor wafer W can be heated to about 150° C. Next, the semiconductor wafer W is mounted on the mounting body 11, and the alignment between the electrode pads P of the semiconductor wafer W and the probes 31 of the probe card 30 is performed while the mounting table 10 is moving. During that time, a temperature of the semiconductor wafer W on the mounting body 11 is set to about 150° C.

Thereafter, the elevation driving mechanism 14 of the mounting table 10 is driven to raise the mounting body 11 together with the support body 12. Thus, the electrode pads P of the semiconductor wafer W on the mounting body 11 are brought into contact with the probes 31 of the probe card 30. Next, if the overdrive is applied, the probes 31 are brought into contact with the electrode pads P of the semiconductor wafer W as shown in FIGS. 4 and 5A. The contact load is detected by the detection units 153 of the pressure sensors 15 at the three locations thereafter. The detection units 153 output the detection signals from the pressure sensors 15 at the three locations to the central processing unit 42. The central processing unit 42 calculates a sum of contact loads detected by the pressure sensors 15 at the three locations based on the control program read from the storage unit 41, and compares the sum of the contact loads with the reference contact load read from the storage unit 41. The elevation driving mechanism 14 is controlled based on the comparison result.

Figure 5A:
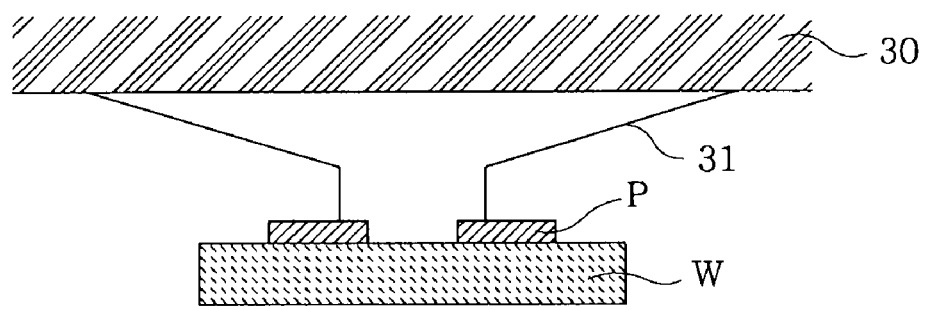
Figure 5B:
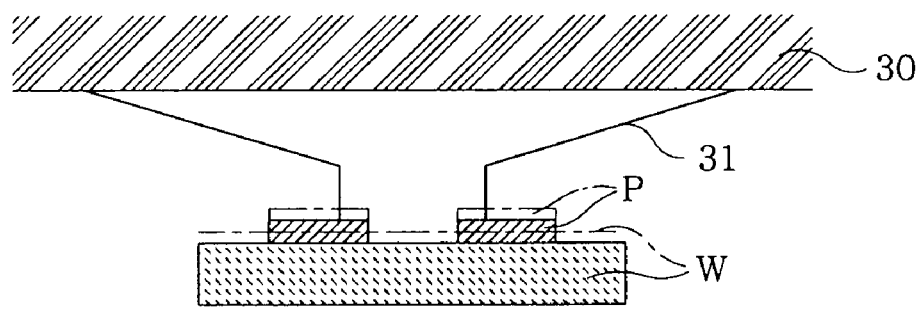
Figure 6:
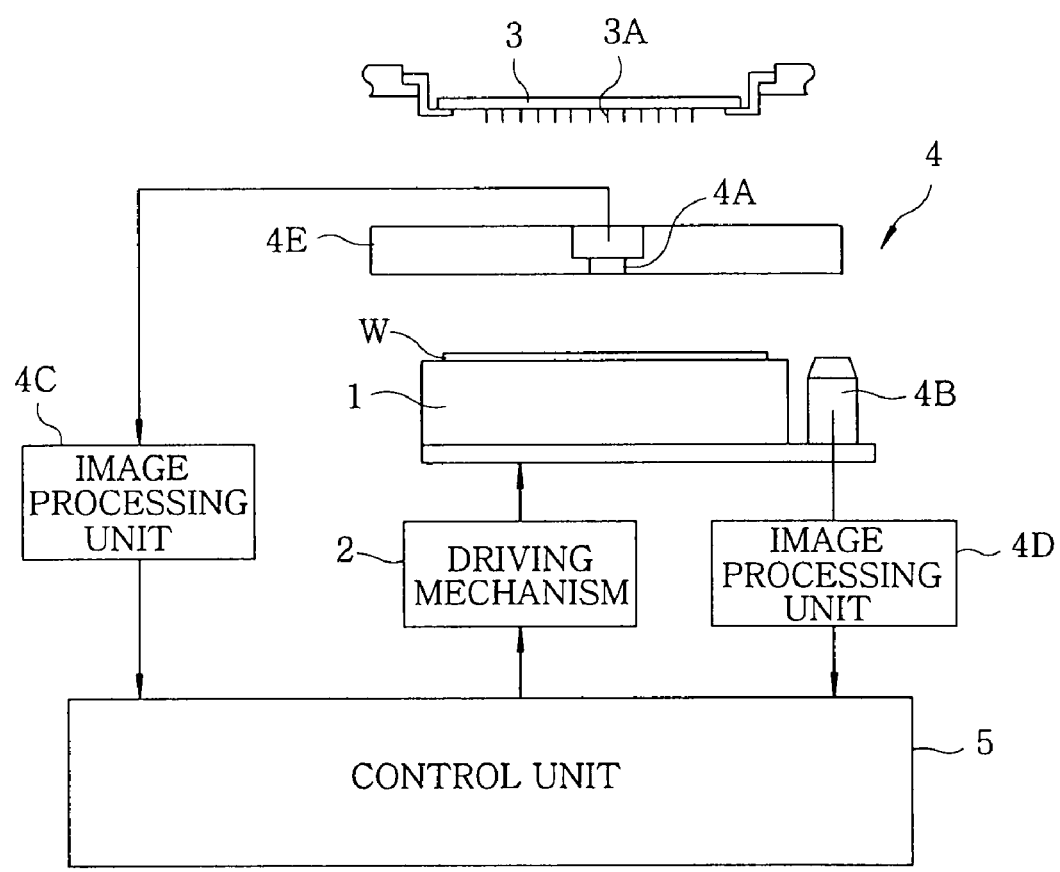
FIG. 6 schematically shows an example of a conventional inspection apparatus.
Figure 7A:
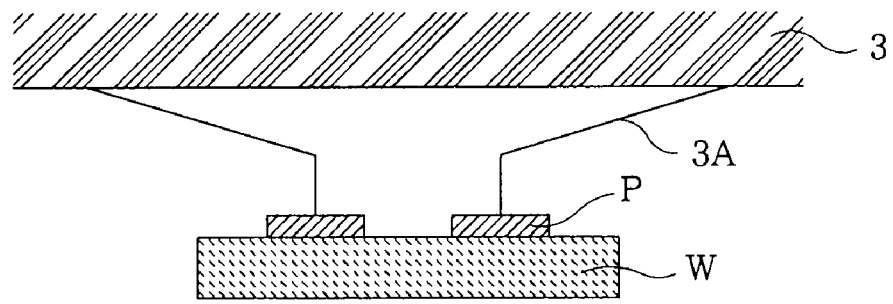
Figure 7B:
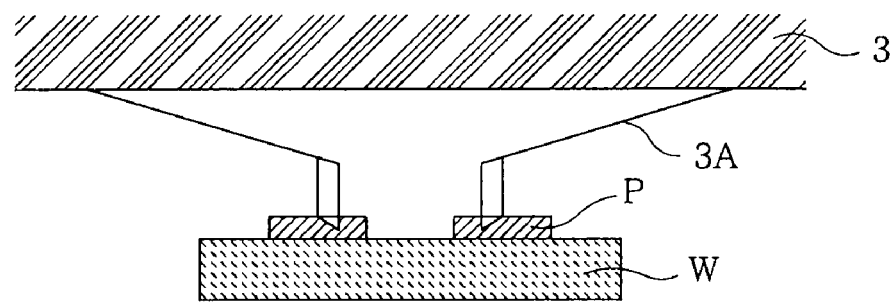

During the high-temperature inspection of the semiconductor wafer W, the probe card 30 is thermally expanded by the heat transmitted from the semiconductor wafer W and, also, the probes 31 are gradually extended from the state shown in FIG. 5A so that the contact load to the mounting body 11 increases. If the contact load increases, the pressure sensors 15 at the three locations detect the increased contact load. The central processing unit 42 compares the detected contact load of the pressure sensors 15 at the three locations with the reference contact load. Based on the comparison result, the extension of the probes 31 due to the thermal expansion of the probe card 30 is compensated by lowering the elevation driving mechanism 14 from a position indicated by a dashed dotted line to a position indicated by a solid line of FIG. 5B, so that the contact load is corrected to match with the reference contact load. Therefore, the high-temperature inspection of the semiconductor wafer W can be reliably carried out by electrically contacting the probes 31 with the electrode pads P of the semiconductor wafer W with an appropriate contact load.

Even if the probe card 30 is thermally expanded during the high-temperature inspection, the elevation driving mechanism 14 is lowered by the central processing unit 42 based on the detection signals from the pressure sensors 15 at the three locations so that the extension of the probes 31 due to the thermal expansion of the probe card 30 can be compensated. Accordingly, the contact load between the probes 31 and the electrode pads of the semiconductor wafer W is constantly corrected to an appropriate contact load and, hence, the high-temperature inspection can be stably performed with high reliability. As a result, the probe card 30 and the semiconductor wafer W can be prevented from being damaged by the thermal expansion of the probe card 30 during the high-temperature inspection.

In addition, the central processing unit 42 can obtain the pressure distribution of the contact load based on the detection signals from the capacitive pressure sensing elements 151 of the pressure sensors 15 at the three locations, and visualize the pressure distribution in a three dimension or simply in a two dimension on the display unit 50. Therefore, the pressure distribution of the contact load can be visually and in a three dimension or simply in a two dimension recognized on the display unit 50.

As set forth above, in accordance with the present embodiment, the inspection apparatus of the present invention includes the movable mounting table 10 for mounting thereon the semiconductor wafer W, the probe card 30 disposed above the mounting table 10, and the control unit 40 for controlling the mounting table 10. The high-temperature inspection of the semiconductor wafer W is performed by bringing the electrode pads of the semiconductor wafer W mounted on the mounting table 10 into contact with the probes 31 of the probe card 30 with a predetermined contact load by overdriving the mounting table 10 under the control of the control unit 40. The mounting table 10 has the mounting body 11 whose temperature is controllable, the support body 12 for supporting the mounting body 11, and the elevation driving mechanism 14 provided in the support body 12. The pressure sensors 15 for detecting the contact load are provided between the mounting body 11 and the support body 12, and the elevation driving mechanism 14 is controlled based on the detection signals from the pressure sensors 15. Therefore, the high-temperature inspection can be performed without preheating the probe card 30, and even if the tip positions of the probes 31 are changed by the extension, the elevation driving mechanism 14 is lowered by the central processing unit 42 based on the detection signals from the pressure sensors 15 so that the extension of the probes 31 can be compensated in real-time. Accordingly, the highly reliable inspection can be carried out while maintaining the contact load between the probes 31 and the semiconductor wafer W to match with appropriate contact load, which prevents the semiconductor wafer W or the probe card 30 from being damaged.

Further, in accordance with the present embodiment, the pressure sensor 15 is formed as an array sensor in which a plurality of capacitive pressure sensing elements 151 is arranged two dimensionally, so that the contact load between the probes 31 and the electrode pads of the semiconductor wafer W can be displayed as a three-dimensional pressure distribution. Furthermore, the control unit 40 can visualize the distribution state of the contact load in a three dimension or simply in a two dimension on the display unit 50 based on the detection signals from the pressure sensors 15. Therefore, the three-dimensional pressure distribution of the contact load can be visually recognized on the display unit 50.

The present invention is not limited to the above-described embodiment, and the components thereof can be appropriately modified. In the above-described embodiment, as for the pressure sensor, the array sensor 152 having the capacitive pressure sensing elements 151 is used. However, it may be a single capacitive pressure sensor, or may a resistant pressure sensor other than the capacitive pressure sensor.

The present invention is suitable for an inspection apparatus for performing a high-temperature inspection of a target object such as a semiconductor wafer or the like.

While the invention has been shown and described with respect to the embodiments, it will be understood by those skilled in the art that various changes and modification may be made without departing from the scope of the invention as defined in the following claims.

What is claimed is:
1. An inspection apparatus comprising:
a movable mounting table for mounting thereon a target object;
a probe card disposed above the mounting table; and
a control unit for controlling the mounting table,
wherein the target object is inspected by bringing a plurality of electrode pads of the target object mounted on the mounting table into contact with a plurality of probes of the probe card with a predetermined contact load by overdriving the mounting table,
wherein the mounting table includes:
a mounting body whose temperature is controllable;
a support body for supporting the mounting body;
an elevation driving mechanism provided in the support body; and
pressure sensors provided between the mounting body and the support body to thereby detect the contact load,
and wherein the control unit controls the elevation driving mechanism in accordance with detection signals from the pressure sensors.

2. The inspection apparatus of claim 1, wherein the pressure sensors are provided along an outer circumference of the mounting body.

3. The inspection apparatus of claim 1, wherein each of the pressure sensors is formed as a capacitive pressure sensor.

4. The inspection apparatus of claim 2, wherein each of the pressure sensors is formed as a capacitive pressure sensor.

5. The inspection apparatus of claim 1, wherein each of the pressure sensors is formed as an array sensor in which a plurality of capacitive pressure sensing elements are arranged two dimensionally.

6. The inspection apparatus of claim 2, wherein each of the pressure sensors is formed as an array sensor in which a plurality of capacitive pressure sensing elements is arranged two dimensionally.

7. The inspection apparatus of claim 1, wherein the control unit visualizes on a display unit three dimensional distribution state of the contact load in a three dimension or simply in a two dimension based on the detection signals from the pressure sensors.

8. The inspection apparatus of claim 2, wherein the control unit visualizes on a display unit three dimensional distribution state of the contact load in a three dimension or simply in a two dimension based on the detection signals from the pressure sensors.

* * * * *